United States Patent [19]
Fedor

[11] 3,798,734
[45] Mar. 26, 1974

[54] COMPONENT PREFORMING MACHINE

[76] Inventor: Gerald S. Fedor, 924 Rosette Court, Sunnyvale, Calif. 94086

[22] Filed: Apr. 6, 1972

[21] Appl. No.: 241,701

[52] U.S. Cl. .................................. 29/203 B
[51] Int. Cl. .................. H01r 43/04, H05k 13/04
[58] Field of Search........ 29/203 B, 203 D, 203 DT, 29/203 TS, 203 R, 205 C

[56] References Cited

UNITED STATES PATENTS

| | | | |
|---|---|---|---|
| 2,867,143 | 1/1959 | Appleton | 29/203 D |
| 3,707,756 | 1/1973 | Wolyn | 29/203 D |

*Primary Examiner*—Thomas H. Eager

[57] ABSTRACT

A component preforming machine for forming the leads from electronic components so that they may be inserted in, and space the component from a circuit board. The machine incorporates a pair of dies that are mounted on the base of the machine. A pneumatic cylinder forces one of the dies toward the other to form the leads. The fixed die is supported on the base of the machine in two pin and bushing combinations, and held in place by a single screw. A die configuration is provided for forming the leads of radial lead components so that the leads may be inserted in the board to space the component from the board and to hold the component upright during processing until the component is firmly secured by soldering. The component leads after forming in this die incorporate oppositely directed semi-circular crimps intermediate the ends of the leads. The crimps eliminate the tendency of the component to rock toward one direction or the other. Each die incorporates a cylindrical protrusion that cooperates with a cylindrical cavity in the opposing die.

7 Claims, 8 Drawing Figures

COMPONENT PREFORMING MACHINE

BACKGROUND OF THE INVENTION

In electronic assembly it is common practice to preform the leads of an electronic component to change the leads and configuration to adapt them to the assembly process. This lead forming is for two distinct purposes. The first purpose is to orient and align the leads in the proper direction with the proper spacing for insertion into holes on a circuit board. The second purpose of preforming is the introduction of a crimp, or other protrusion in the lead between its ends, to provide stand-off spacing, so the body of the electronic component is spaced away from the surface of the circuit board. The spacing is necessary to obtain good solder joints. Proper spacing prevents the meniscus of molded circuit components from contacting the hole and drawing molten solder and/or flux out of the hole. Proper spacing is also necessary to prevent the body portion of a component from contacting the surface of the board. This spacing permits effective cleaning of the flux and foreign matter to ensure good solder joints.

While it has been recognized in the art, that component preforming is a necessary and desirable operation, a machine had not been provided that was capable of expeditiously producing this preforming without introducing other undesirable characteristics. Further no prior art machine produces formed leads that maintain a component upright on the board during processing.

Additionally, component forming machines have been expensive to purchase and have had poor reliability and operating characteristics while being insufficiently precise to properly form the components without damaging the molded body portion or introducing foreign matter to the conductor elements. Another objectionable characteristic of prior art machines is that they normally require a large number of dies to cover a range of component sizes and require different dies for components with different lead spacings.

Thus, it is desirable to have a component forming machine that has stable operating characteristics over a relatively long life with easily changed dies, especially where such a machine can form radial components within a range of pin sizes, using only a single die set, and producing crimped components that remain upright on the board during processing until the component is firmly soldered in place.

SUMMARY OF THE INVENTION

An exemplary embodiment of the invention incorporates a frame means or base for receiving first and second die means. The die means are relatively movable and are forced between an open and closed or contacting position by a power means. The fixed die is secured to the base so that it is firmly fixed in position and does not move, by a pair of cooperating pin and bushings. The bushing is normally received in the base and comprise hardened steel inserts that have good wear characteristics despite the high stresses induced during the operation of the apparatus. The pins are secured in the die and are inserted within the bushings to mount the die on the machine. The die is retained on the base by a removable fastener, typically a screw. The movable die is connected to the power means that may be a pneumatic piston-cylinder for guided movement on the base.

The machine is especially adapted and finds particular utility when used in conjunction with dies of the invention, that are utilized for the purpose of crimping and cutting the leads of radial lead components. Each die incorporates a cylindrical protrusion that cooperates with a cylindrical cavity on the opposite die. The effect of these die components is to produce a semi-circular crimp intermediate the ends of the component leads. The crimp is of such a diameter that it does not allow the capacitor lead to pass through the hole on the circuit board and thereby space the component from the top surface of the board. The second effect of the die, by providing oppositely directed concavities, is to protect against rocking or other unstability in the component, while it is received in the board, and prior to it being permanently affixed thereon. The plane that is described by the semi-circular portions on each lead is parallel to the plane described by the semi-circular portion of the opposite lead, and these planes are perpendicular to the plane that includes the radial leads in their entirety. This configuration causes the crimps to contact the opposite side of the respective holes in the circuit board.

Thus, the component is significantly different than crimped components utilizing oppositely directed semi-circular portions for spacing that are placed in the same plane that contains the leads. These components can not prevent rocking and can produce cold solder joints or components that become dislodged prior to soldering.

It is therefore an object of the invention to provide a new and improved component preforming machine.

It is another object of the invention to provide a new and improved component preforming machine that is low in cost.

It is another object of the invention to provide a new and improved component preforming machine that has a long operating life.

It is another object of the invention to provide a new and improved component preforming machine that is capable of forming components so they are spaced from the surface of an electronic circuit board and maintain upright until final fastening thereon.

It is another object of this invention to provide a new and improved component preforming machine that provides for fast, high strength, die mounting.

It is another object of the invention to provide a new and improved die set for use in conjunction with a component preforming machine.

It is another object of the invention to provide a new and improved die set that produces components having oppositely directed concavities to reduce rocking or other movement during placement on, and processing of, electronic circuit boards.

Other objects and many attendant advantages of this invention will become more apparent upon a reading of the following detailed description together with the drawings, in which like reference numerals refer to like parts throughout, and in which.

Figure 1:
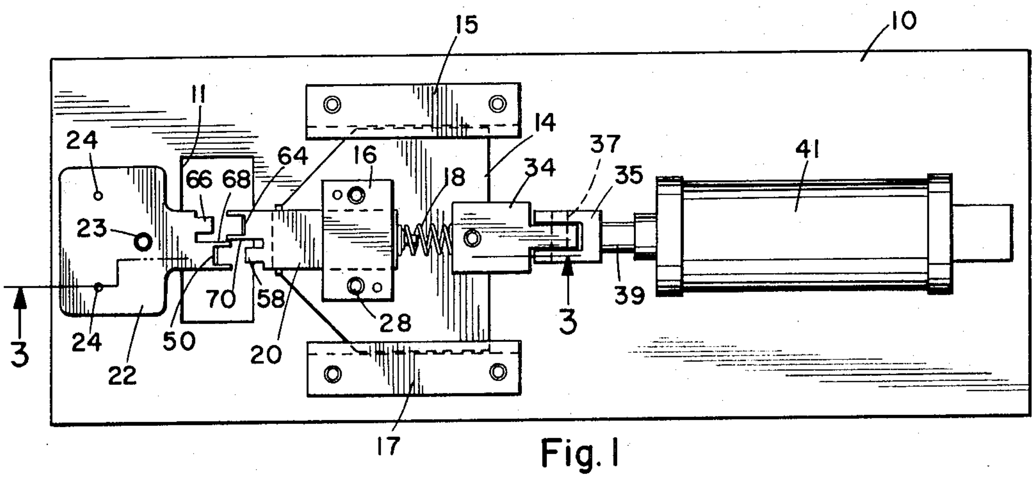
FIG. 1 is a top plan view of the dies mounted on the machine.

Referring now to the drawing, there is illustrated the component preforming machine of the invention including a base 10 on which is mounted the power means or actuator 41, slide block 14, movable die 20 and fixed die 22.

The fixed die 22 is held in place on the base 10 by a pair of hardened steel pins 24 received in hardened steel bushings 26 inserted in the base plate 10. The fixed die's position on the base plate is secured by a single screw element 23 received in a threaded hole in the base plate. The pin and bushing combination produces a high strength mounting that can withstand many thousands of cycles without excessive wear. The slide block 14 is retained for reciprocating movement by lateral guides 15 and 17.

The movable die 20 is supported for guided, sliding movement on the slide block 14. Vertical and lateral guidance is provided by a bridge member 16 secured to the slide block by screws 28 and having a rectangular opening 19 that is just larger than the rectangular cross section of the movable die 20. The slide block 14 is secured by fastener 36 to a first pivot connector 34, which is secured by a pivot pin 37 to second pivot connector 35. The resulting pivotal connection allows for minor misalignment without binding. The connector 35 is integrally connected to the output shaft 39 of actuator 41. Therefore movement of the piston within the actuator 41, caused by the application of pneumatic pressure from a suitable source (not shown), is directly communicated through the connectors to the slide block 14. Movement of the slide block 14 also causes movement of the movable die 20, through the inner connection of spring 18, bearing against surface 32, of the connector 34 and retained on the movable die by a retaining pin 30. Thus the movable die and slide block 14 move together until resistance is encountered by the movable die. When such resistance exceeds the spring constant of spring 18, the movement of the slide block 14 continues to the full stroke of the actuator.

The terminable end of the actuator block is cut off at an angle to create a cutting edge 38 for the purpose of shearing component leads. A deflector plate 13 is mounted on the lower surface of the base plate 10 to cause the cut ends of the leads to fall through the opening 11 into waste bin 23.

Figure 2:
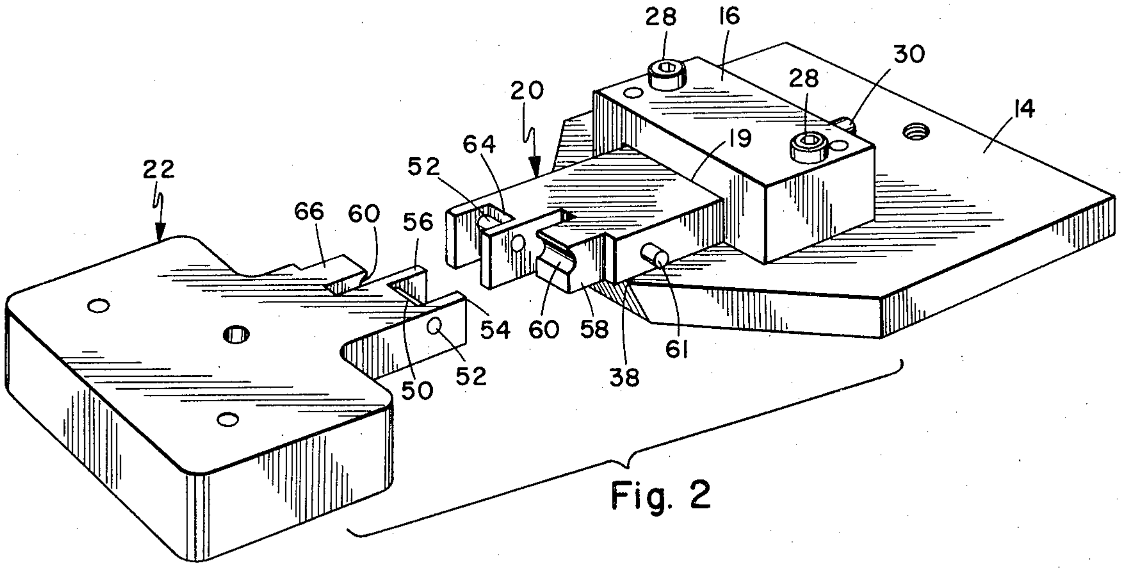
FIG. 2 is an enlarged perspective view of the dies.

The unique configuration of the die that produces the stable component configuration of the invention is thus illustrated in FIG. 2. Each die 20 and 22 includes plug and socket portions side by side. Die 20 incorporates a plug portion 58 and a forked socket portion 64. Die 22 incorporates a socket portion 50 and a plug portion 66. Plug portion 58 comprises a generally rectangular extension of the main die body having a transverse cylindrical concabity 60 on its front face. The concavity 60 is of a size to cooperate with cylindrical pin 52 supported between forks 54 and 56 of socket portion 50. The outer diameter of pin 52 is slightly smaller than the diameter of the circle describing the concavity 60, to accommodate for the thickness of the component leads in a manner to be described more fully hereinafter. The plug and socket portions 64 and 66 are configured identically to the portions 50 and 58 and include a cooperating pin and cavity in the same manner. The adjacent faces 68 and 70 of the socket portions 50 and 64, respectively, as illustrated in FIG. 1 are maintained in sliding contact throughout the range of travel of the dies to guide the plug portions into the respective sockets.

Figure 6:
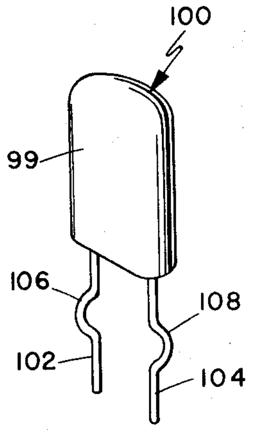
FIG. 6 is a perspective view of a typical completed component.
Figure 7:
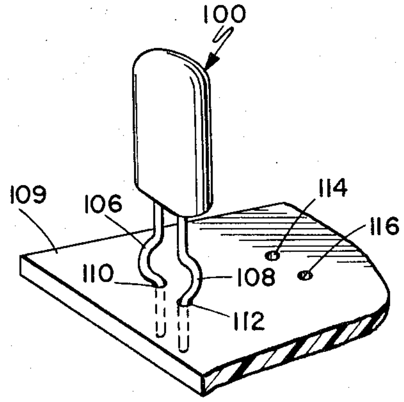
FIG. 7 is a perspective view of the component mounted on a circuit board.

Referring now to FIGS. 6 and 7, there is illustrated the finished configuration of a component 100, after it has been formed by the machine of the invention. The component 100 incorporates a body portion 99 from which depend plural leads 102 and 104. The leads are formed intermediate their ends with curved oppositely directed arcuate sections 106 and 108. The arcuate sections open in opposite directions, which directions are perpendicular to the plane described by the component leads generally. The effect of this configuration is best illustrated in FIG. 7 where the component is installed in a circuit board 109, with the exterior surface of the arcuate sections contacting the outer edges 110 and 112 of the holes producing opposed supporting bias to prevent the component from rocking.

Figure 8:
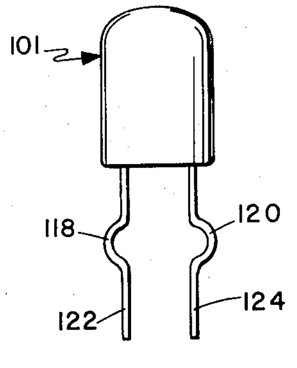
Fig. 8 PRIOR ART
FIG. 8 is a side elevation view of a component with the leads formed according to prior art technique.

FIG. 8 illustrates a component, formed according to prior art techniques. The component 101 is distinguished from that of the invention because it includes arcuate sections 118 and 120 on leads 122 and 124 with openings that face one another in coplanar relation. The directions that the openings face are parallel to the plane describing the leads generally. When a component formed like component 101 is installed in holes, such as holes 114 and 116 in FIG. 7, there is no oppositely directed support to prevent the component from rocking in the holes. This rocking movement can produce cold solder joints.

OPERATION

Figure 3:
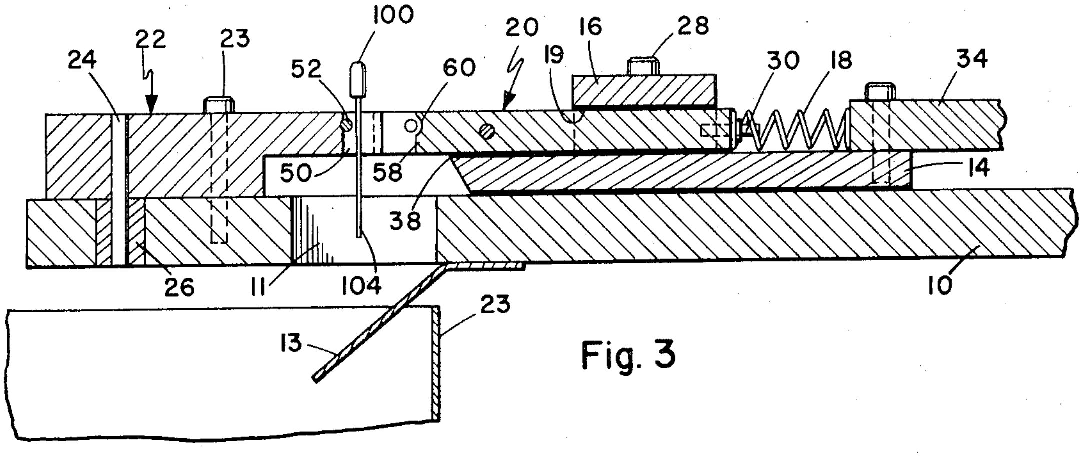
FIG. 3 is an enlarged sectional view taken on line 3—3 of FIG. 1, with a component positioned for forming.
Figure 4:
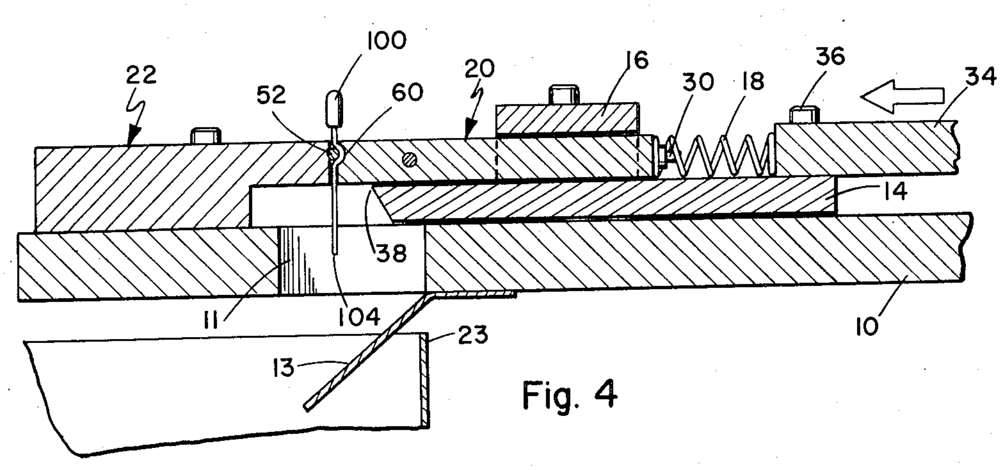
FIG. 4 is a similar sectional view showing the lead forming action.
Figure 5:
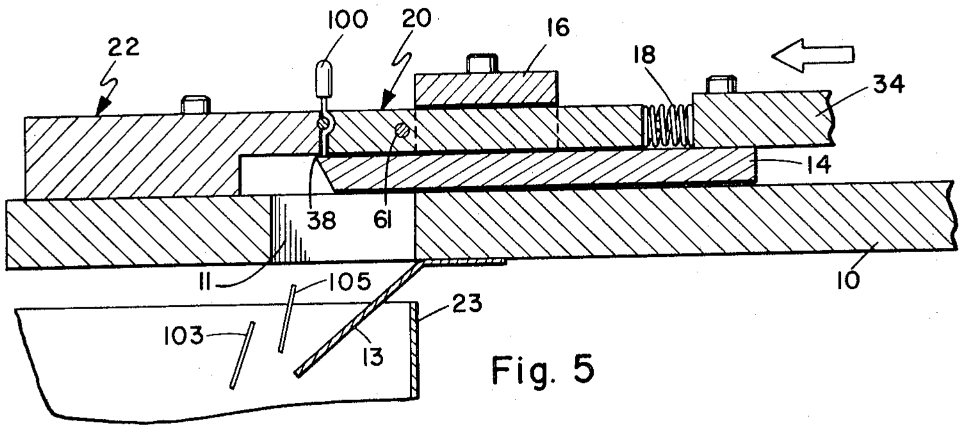
FIG. 5 is a similar section view showing the lead cut off action.

The operation of the component preforming machine of the invention is best understood by reference to FIGS. 3, 4 and 5. In FIG. 3, the movable die and slide block are shown in their retracted position. The effect of this retraction is to create a spacing between the movable die 20 and fixed die 22. The component 100 is inserted into this opening with the leads downward. The component may be held in position by hand or by suitable means, so that the proper distance between the component body and the arcuate sections is produced. With the component in position, the power means 41 is activated to supply translational force through connector 34 and spring 18 to the movable die 20. The movable die contacts the leads and forms the arcuate portions between pins 52 and concavities 60. This position is illustrated in FIG. 4. The effect of the spring is to create a controlled application of force to the component leads, holding the component firmly without undue strain, to protect the integrity of the body portion. The continued application of force by the power means eventually overcomes the resistance of the spring 18 and results in the continued movement of the slide block 14 under the movable die until the cutting edge 38 of the slide block shears the excess component leads 103 and 105, as in FIG. 5. The slide block produces a clean shearing cut because the component is firmly held in position between the dies by the spring pressure exerted through spring 18. Pin 61 acts as a limit stop when it contacts the front face of member 16 transferring final forming pressure to the dies. At the completion of the stroke of the power means, pressure is transferred to the retraction side of the piston and the power means retracts the slide block and the movable die, until they resume the position illustrated in FIG. 3. After the die has re-opened, the finished component, with arcuate sections and trimmed leads, may be removed by the operator. The machine is capable of withstanding extremely high cycle repetitions due in part to the method of securing the fixed die to the bed of the machine through hardened steel pins 24 and bushings 26.

Having described my invention, I now claim.

1. A component preforming machine for crimping the leads of an electronic component to space the body of said component from a circuit board comprising:

base means, first and second die means received on said base means for crimping the leads of a component having at least two leads, the crimped portion of at least two of said leads being in a substantially semicircular configuration, said die means being relatively moveable, power means for forcing said first and second die means toward one another, at least one of said die means being secured against movement with respect to said base means by cooperating pin and bushing combinations, said pin and bushing combinations comprising high strength, hardened material.

2. The component preforming machine of claim 1 wherein:

said pin and bushing combinations are in an engaged relationship by a removable fastener securing said die to said base.

3. A pair of dies for a component preforming machine for crimping the leads of an electronic component to space the body of said component from a circuit board comprising:

first and second die means for receiving the generally vertically oriented lead of said component and for forming said leads into arcuate sectors that open in opposite directions on opposed leads, said arcuate sectors being substantially right angularly related to the plane that includes the straight portions of said leads.

4. The dies of claim 3 wherein:

said die means for cutting off said leads to a predetermined total length after forming.

5. The dies of claim 3 wherein:

said first die means comprises a generally cylindrical protrusion and a horizontally opposed cylindrical cavity;

and said second die means comprises cooperative protrusion and cavity means for being received in and over said cylindrical protrusions and cavity of said first die means.

6. The dies of claim 5 wherein:

the protrusion of said second die means comprises a cylindrical means having an outer diameter that is smaller than the inner diameter of said first die means for accommodating the lead of the component to be formed;

and the cavity of said second die means comprises cylindrical means having an inside diameter larger than the outer diameter of said cylindrical protrusion of said first die means for accommodating the lead of the component to be formed.

7. The dies of claim 5 wherein:

said first and second die means for accommodating components having a substantial variation in spacing between leads.

* * * * *